(12) United States Patent
Yang et al.

(10) Patent No.: US 7,897,995 B2
(45) Date of Patent: Mar. 1, 2011

(54) LATERAL BIPOLAR JUNCTION TRANSISTOR WITH REDUCED BASE RESISTANCE

(75) Inventors: Ming-Tzong Yang, Hsinchu County (TW); Tao Cheng, Hsinchu (TW); Ching-Chung Ko, Hsinchu County (TW); Tung-Hsing Lee, Taipei County (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 152 days.

(21) Appl. No.: 12/420,046

(22) Filed: Apr. 7, 2009

(65) Prior Publication Data

US 2010/0252860 A1    Oct. 7, 2010

(51) Int. Cl.
*H01L 29/735* (2006.01)
(52) U.S. Cl. .............. 257/133; 257/378; 257/E29.187; 257/E29.197; 257/558

(58) Field of Classification Search .................. 257/133, 257/378, E29.187, 588, E29.197
See application file for complete search history.

(56) References Cited

U.S. PATENT DOCUMENTS

| | | | |
|---|---|---|---|
| 5,139,961 A | 8/1992 | Solheim et al. | |
| 5,717,241 A * | 2/1998 | Malhi et al. | 257/378 |
| 2010/0252860 A1 | 10/2010 | Yang | |

* cited by examiner

*Primary Examiner* — Kiesha R Bryant
*Assistant Examiner* — Tucker Wright
(74) *Attorney, Agent, or Firm* — Winston Hsu; Scott Margo

(57) ABSTRACT

A lateral bipolar junction transistor formed in a semiconductor substrate includes an emitter region; a base region surrounding the emitter region; a gate disposed at least over a portion of the base region; a collector region having at least one open side and being disposed about a periphery of the base region; a shallow trench isolation (STI) region disposed about a periphery of the collector region; a base contact region disposed about a periphery of the STI region; and an extension region merging with the base contact region and laterally extending to the gate on the open side of the collector region.

17 Claims, 3 Drawing Sheets

LATERAL BIPOLAR JUNCTION TRANSISTOR WITH REDUCED BASE RESISTANCE

BACKGROUND OF THE INVENTION

1. Field of the Invention

The invention relates to the field of semiconductor technology and, more particularly, to a CMOS-based lateral bipolar junction transistor (lateral BJT) with reduced base resistance.

2. Description of the Prior Art

Bipolar junction transistors or bipolar transistors, which are formed using a CMOS compatible process, are well known in the art. These bipolar transistors are also referred to as lateral bipolar junction transistors and have high threshold frequency (Ft) and high beta.

In the design of semiconductor integrated circuits, it is often desirable to provide a mixed mode device, i.e., which has both BJT and CMOS functions. Mixed mode devices both increase the flexibility of the IC design and increase the performance of the IC. The integration of CMOS transistors with bipolar transistors to provide Bipolar-CMOS (BiCMOS) integrated circuits is now well established. BiCMOS circuits provide advantages such as high speed, high drive, mixed voltage performance with analog-digital capabilities, which are beneficial in applications such as telecommunications. However, there is considerable challenge in optimizing the performance of both CMOS and bipolar devices fabricated with progressively reduced dimensions. In order to fabricate an integrated circuit combining both bipolar transistors and field effect transistors on the same chip, compromises must be made during both design and fabrication to optimize performance of both bipolar and field effect transistors, without inordinately increasing the number of processing steps.

The lateral bipolar transistor is fabricated using a typical lightly doped drain (LDD) MOS transistor. An NPN device is formed from an NMOS transistor and a PNP device is formed from a PMOS transistor. The base width of the lateral bipolar transistor is determined by and is usually equal to the MOS channel length. It is desirable to have a CMOS-based bipolar transistor having improved bipolar performance, such as reduced base resistance.

SUMMARY OF THE INVENTION

It is one object of this invention to provide a CMOS-based lateral bipolar junction transistor (lateral BJT) with reduced base resistance.

According to the claimed invention, a lateral bipolar junction transistor formed in a semiconductor substrate includes an emitter region; a base region surrounding the emitter region; a gate disposed at least over a portion of the base region; a collector region having at least one open side and being disposed about a periphery of the base region; a shallow trench isolation (STI) region disposed about a periphery of the collector region; a base contact region disposed about a periphery of the STI region; and an extension region merging with the base contact region and laterally extending to the gate on the open side of the collector region. The lateral bipolar junction transistor may be a lateral PNP bipolar junction transistor or a lateral NPN bipolar junction transistor.

These and other objectives of the present invention will no doubt become obvious to those of ordinary skill in the art after reading the following detailed description of the preferred embodiment that is illustrated in the various figures and drawings.

DETAILED DESCRIPTION

The structure and layout of the present invention lateral bipolar junction transistor (LBJT) with reduced base resistance are described in detail. The improved LBJT structure is described for a lateral PNP bipolar transistor, but it should be understood by those skilled in the art that by reversing the polarity of the conductive dopants lateral NPN bipolar transistors can be made.

Figure 1:
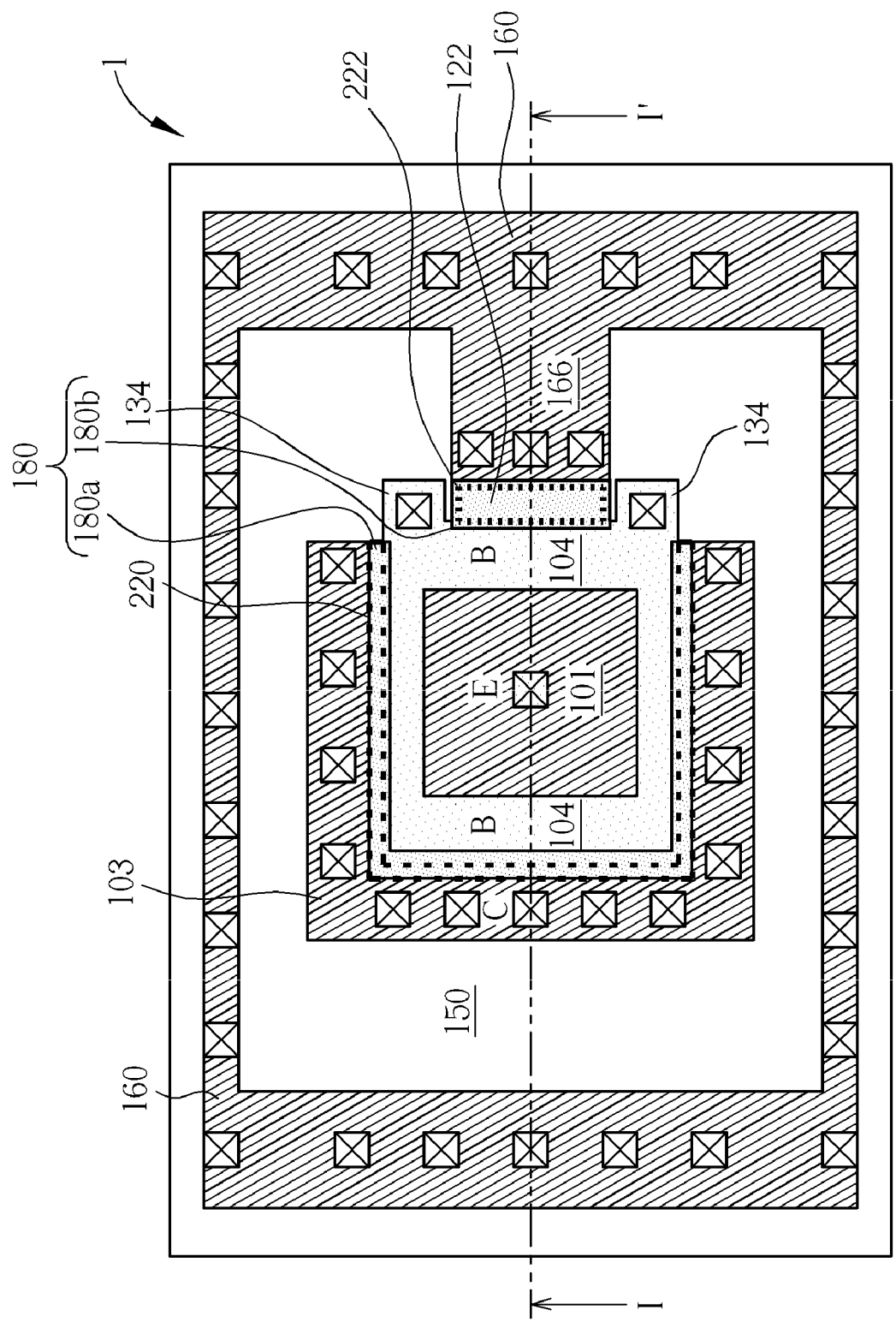
FIG. 1 is a top planar view of a layout of the lateral bipolar transistor according to one embodiment of the invention.
Figure 2:
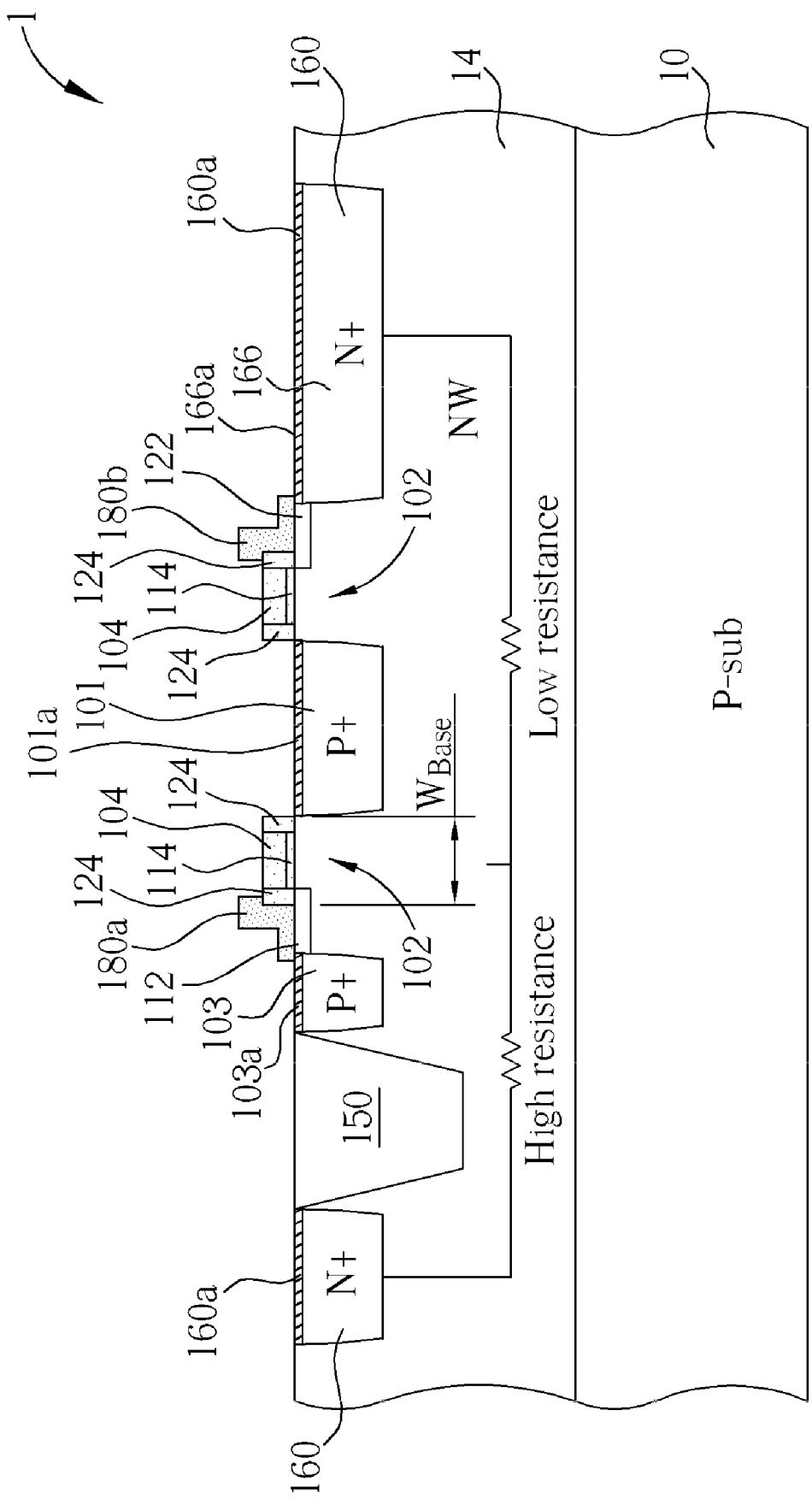
FIG. 2 is a schematic, cross-sectional view of the transistor in FIG. 1, taken along line I-I' of FIG. 1.

Please refer to FIG. 1 and FIG. 2. FIG. 1 is a top planar view of a layout of the lateral bipolar transistor according to one embodiment of the invention. FIG. 2 is a schematic, cross-sectional view of the transistor in FIG. 1, taken along line I-I' of FIG. 1. As shown in FIG. 1 and FIG. 2, the lateral PNP bipolar transistor 1 is formed in a semiconductor substrate 10 such as a P type doped silicon substrate. The lateral PNP bipolar transistor 1 may include a P+ doped region 101 that functions as an emitter region of the lateral PNP bipolar transistor 1, which may be formed within an N well (NW) 14. It is understood that the rectangular shape of the emitter region 101 as set forth in FIG. 1 is merely exemplary. The emitter region 101 may have other polygonal shapes.

A base region 102 underlying an annular polysilicon gate 104 may be disposed about a periphery of the emitter region 101. A voltage can be applied on the polysilicon gate 104 to change the characteristics of the lateral PNP bipolar transistor 1. It is understood that the shape of the polysilicon gate 104 as set forth in FIG. 1 is merely exemplary. The polysilicon gate 104 may have a polygonal shape corresponding to the shape of the emitter region 101. The base width ($W_{Base}$) is substantially equal to the gate length.

A P+ doped region 103 that functions as a collector region of the lateral PNP bipolar transistor 1 may be formed within the N well 14 and may be disposed about a periphery of the base region 102. A shallow trench isolation (STI) region 150 may be disposed about a periphery of the collector region 103. An annular N+ base contact region 160 may be disposed about a periphery of the STI region 150.

According to the embodiment of this invention, the top view of the P+ doped region 103 and the top view of the STI region 150 may both be analogous to a capital letter C. As shown in FIG. 1, the P+ doped region 103 is disposed along three sides of the rectangular polysilicon gate 104 and has at least one open side. On the open side of the P+ doped region 103 and the STI region 150, an N+ extension region 166 may laterally extend to an outer edge of the rectangular polysilicon gate 104. The N+ extension region 166 may merge with the annular N+ base contact region 160.

According to this invention, the polysilicon gate 104 may extend outward to the STI region 150 on the open side of the P+ doped region 103 to form a gate extension 134. This gate extension 134 facilitates the layout and formation of gate contacts.

According to one embodiment of the present invention, the N well 14, the emitter region 101, the collector region 103, the STI region 150, the N+ base contact region 160 and the polysilicon gate 104 may be formed simultaneously with the formation of respective diffusion regions and gate structures of CMOS devices. The polysilicon gate 104 may serve as an implant blockout mask during the formation of the emitter region 101 and the collector region 103. It is noteworthy that during the implantation of the emitter region 101 and the collector region 103, an additional source/drain block 220, which is indicated by dotted line in FIG. 1, may be employed to pull back the collector region 103 away from the outer edge of the polysilicon gate 104. A higher $BV_{CEO}$ may be obtained if the collector region 103 is pulled away from the outer edge of the polysilicon gate 104. The source/drain block 220 may be employed to mask a portion of the active area or oxide defined (OD) area adjacent to the polysilicon gate 104 during the source/drain ion implant.

Likewise, on the open side of the P+ doped region 103 and the STI region 150, a source/drain block 222 may be employed to mask a portion of the active area adjacent to the polysilicon gate 104 during the source/drain ion implant to pull back the N+ extension region 166 away from the outer edge of the polysilicon gate 104.

As best seen in FIG. 2, a gate dielectric layer 114 is provided between the polysilicon gate 104 and the base region 102. In one embodiment, the gate dielectric layer 114 may be formed simultaneously with the formation of gate oxide layer in CMOS devices for input/output (I/O) circuits. Accordingly, the gate dielectric layer 114 underlying the polysilicon gate 104 of the lateral PNP bipolar transistor 1 may have a thickness that is substantially equal to that of the gate oxide layer in CMOS devices for I/O circuits. By doing this, gate current (Ig) and GIDL (gate induced drain leakage) can be both reduced. On the two opposite sidewalls of the polysilicon gate 104, spacers 124 are provided.

In one embodiment, a P type lightly doped drain (PLDD) 112 may be situated between the collector region 103 and the polysilicon gate 104. The PLDD 112 may be disposed only along the outer edge of the polysilicon gate 104 that is adjacent to the collector region 103, while on the inner edge that is adjacent to the emitter region 101, no LDD is provided. In one aspect, the single sided PLDD 112 may be deemed a collector extension. On the open side of the P+ doped region 103 and the STI region 150, a PLDD 122 may be disposed between the polysilicon gate 104 and the N+ extension region 166.

According to one embodiment of this invention, the PLDD 112 and the PLDD 122 may be formed simultaneously with the formation of PLDD regions in CMOS devices. It is noteworthy that since the collector region 103 and the N+ extension region 166 may pull back, the PLDD 112 and the PLDD 122 may both extend outward from the bottom of the spacers 124. The STI region 150 creates a relatively high resistance path for the current flow. On the open side of the P+ doped region 103, the elimination of a portion of the STI and the introduction of the N+ extension region 166 significantly reduce the base resistance. The N+ extension region 166 disposed on the open side of the STI region 150 provides a relatively low resistance path for the current flow, thereby improving the bipolar performance.

In the embodiment shown in FIGS. 1 and 2, a salicide block (SAB) layer 180 comprising a C-shaped SAB segment 180a and a vertical SAB segment 180b may be disposed about a periphery of the polysilicon gate 104. The C-shaped SAB segment 180a and the vertical SAB segment 180b are formed on or over the PLDD 112 and the PLDD 122 respectively. The vertical SAB segment 180b on the open side of the P+ doped region 103 and the STI region 150 can avoid gate accumulation and low gain. The SAB layer 180 may extend up to the spacers 124 and the polysilicon gate 104.

According to the embodiments of this invention, the SAB layer 180 may be composed of a dielectric material such as silicon oxide or silicon nitride. After the formation of the SAB layer 180, an emitter salicide 101a may be formed on the emitter region 101. A collector salicide 103a may be formed on the exposed portion of the collector region 103. Thus, the collector salicide 103a may be pulled back away from the outer edge of the polysilicon gate 104. A base salicide 160a and salicide 166a may be formed on the N+ base contact region 160 and the N+ extension region 166 respectively.

The salicides 101a, 103a, 160a and 166a may be formed by depositing a metal over the substrate 10. Such metal reacts with the semiconductor material of the exposed regions to form the salicides, which provides low resistance contact to the emitter, the base and the collector of the lateral PNP bipolar transistor 1. The SAB layer 180 at the collector region 103 prevents formation of salicide over the PLDD 112 and pulls the salicide away from the outer edge of the polysilicon gate 104. It is noteworthy that no SAB layer is formed on the emitter region 101. By providing the SAB layer 180 in the lateral PNP bipolar transistor 1, the leakage current due to salicide spike in the PLDD 112 and PLDD 122 may be avoided.

Figure 3:
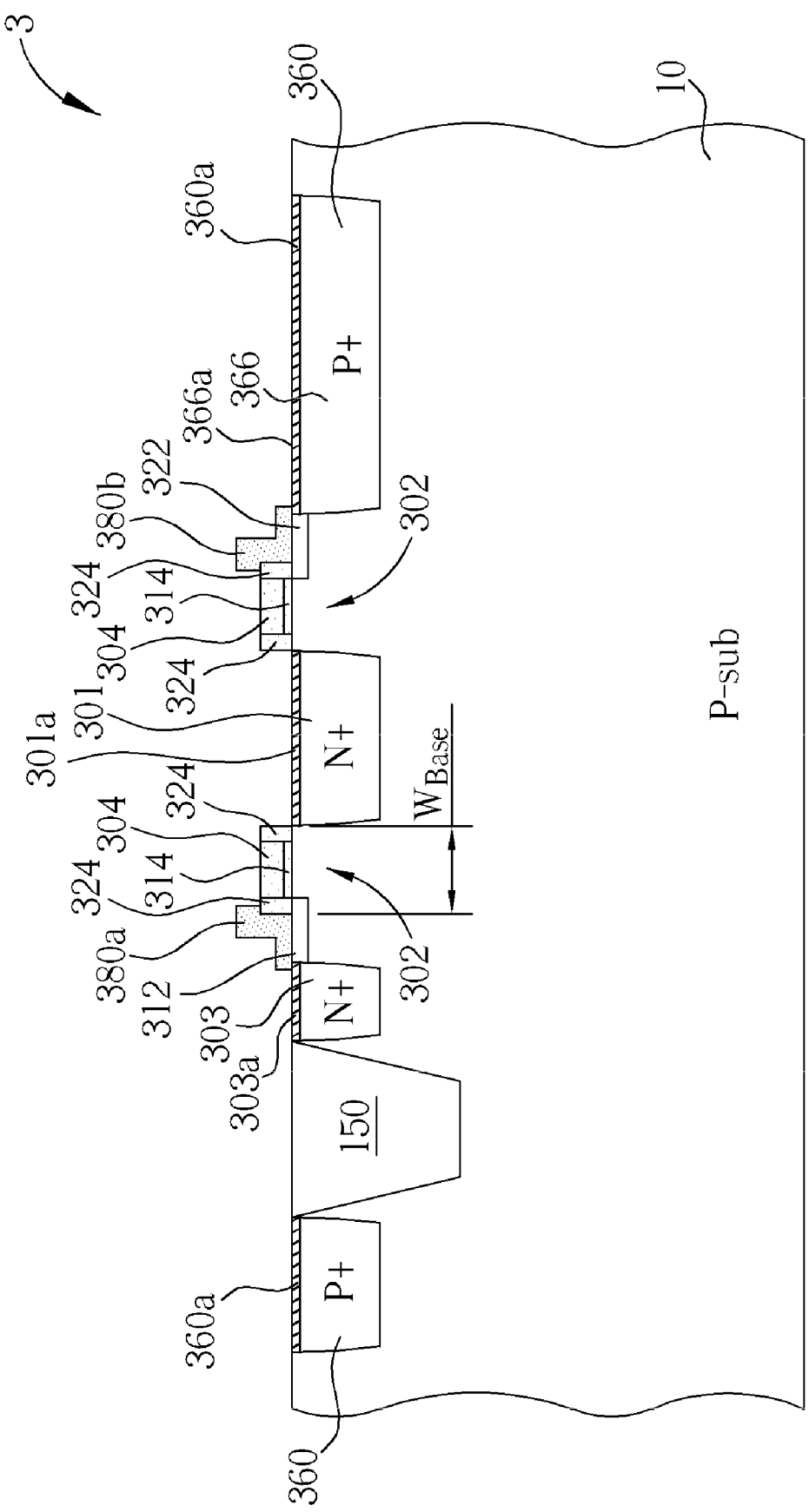
FIG. 3 is a sectional view of a lateral NPN bipolar transistor according to another embodiment of the invention.

FIG. 3 is a sectional view of a lateral NPN bipolar transistor according to another embodiment of the invention. As shown in FIG. 3, the lateral NPN bipolar transistor 3 is formed in a semiconductor substrate 10 such as a P type doped silicon substrate. In another embodiment, the lateral NPN bipolar transistor 3 may be formed within a P well on a deep N well in the semiconductor substrate 10 such as a P type doped silicon substrate. The lateral NPN bipolar transistor 3 may include an N+ doped region 301 that functions as an emitter region of the lateral NPN bipolar transistor 3. A base region 302 underlying an annular polysilicon gate 304 may be disposed about a periphery of the emitter region 301. An N+ doped region 303 that functions as a collector region of the lateral NPN bipolar transistor 3 may be disposed about a periphery of the base region 302.

A shallow trench isolation (STI) region 150 may be disposed about a periphery of the collector region 303. An annular P+ base contact region 360 may be disposed about a periphery of the STI region 150. The top view of the N+ doped region 303 and the top view of the STI region 150 may both be analogous to a capital letter C. The N+ doped region 303 may be disposed along three sides of a rectangular polysilicon gate 304 and have at least one open side. On the open side of the N+ doped region 303 and the STI region 150, a P+ extension region 366 may laterally extend to an outer edge of the rectangular polysilicon gate 304. The P+ extension region 366 may merge with the annular P+ base contact region 360. The polysilicon gate 304 may extend outward to the STI region 150 on the open side of the N+ doped region 303 to form a gate extension 334. This gate extension 334 facilitates the layout and formation of gate contacts.

The emitter region 301, the collector region 303, the STI region 150, the P+ base contact region 360 and the polysilicon gate 304 may be formed simultaneously with the formation of respective diffusion regions and gate structures of CMOS devices. The polysilicon gate 304 may serve as an implant blockout mask during the formation of the emitter region 301 and the collector region 303. It is noteworthy that during the implantation of the emitter region 301 and the collector region 303, an additional source/drain block may be employed to pull back the collector region 303 away from the outer edge of the polysilicon gate 304. A higher $BV_{CEO}$ may be obtained if the collector region 303 is pulled away from the outer edge of the polysilicon gate 304. The source/drain block may be employed to mask a portion of the active area or oxide defined (OD) area adjacent to the polysilicon gate 304 during the source/drain ion implant.

On the open side of the N+ doped region 303 and the STI region 150, a source/drain block may be employed to mask a portion of the active area adjacent to the polysilicon gate 304 during the source/drain ion implant to pull back the P+ extension region 366 away from the outer edge of the polysilicon gate 304. A gate dielectric layer 314 is provided between the polysilicon gate 304 and the base region 302. The gate dielectric layer 314 may be formed simultaneously with the formation of gate oxide layer in CMOS devices for input/output (I/O) circuits. Accordingly, the gate dielectric layer 314 underlying the polysilicon gate 304 of the lateral NPN bipolar transistor 3 may have a thickness that is substantially equal to that of the gate oxide layer in CMOS devices for I/O circuits. By doing this, gate current (Ig) and GIDL (gate induced drain leakage) can be both reduced. On the two opposite sidewalls of the polysilicon gate 304, spacers 324 are provided.

An N type lightly doped drain (NLDD) 312 may be situated between the collector region 303 and the polysilicon gate 304. The NLDD 312 may be disposed only along the outer edge of the polysilicon gate 304 that is adjacent to the collector region 303, while on the inner edge that is adjacent to the emitter region 301, no LDD is provided. In one aspect, the single sided NLDD 312 may be deemed a collector extension. On the open side of the N+ doped region 303 and the STI region 150, an NLDD 322 may be disposed between the polysilicon gate 304 and the P+ extension region 366.

The NLDD 312 and the NLDD 322 may be formed simultaneously with the formation of NLDD regions in CMOS devices. It is noteworthy that since the collector region 303 and the P+ extension region 366 may pull back, the NLDD 312 and the NLDD 322 may both extend outward from the bottom of the spacers 324. The STI region 150 creates a relatively high resistance path for the current flow. On the open side of the P+ doped region 303, the elimination of a portion of the STI and the introduction of the P+ extension region 366 significantly reduce the base resistance. The P+ extension region 366 disposed on the open side of the STI region 150 provides a relatively low resistance path for the current flow, thereby improving the bipolar performance.

A salicide block (SAB) layer 380 comprising a C-shaped SAB segment 380a and a vertical SAB segment 380b may be disposed about a periphery of the polysilicon gate 304. The C-shaped SAB segment 380a and the vertical SAB segment 380b are formed on or over the NLDD 312 and the NLDD 322 respectively. The vertical SAB segment 380b on the open side of the P+ doped region 303 and the STI region 150 can avoid gate accumulation and low gain. The SAB layer 380 may extend up to the spacers 324 and the polysilicon gate 304.

The SAB layer 380 may be composed of a dielectric material such as silicon oxide or silicon nitride. After the formation of the SAB layer 380, an emitter salicide 301a may be formed on the emitter region 301. A collector salicide 303a may be formed on the exposed portion of the collector region 303. Thus, the collector salicide 303a may be pulled back away from the outer edge of the polysilicon gate 304. A base salicide 360a and salicide 366a may be formed on the P+ base contact region 360 and the P+ extension region 366 respectively.

The salicides 301a, 303a, 360a and 366a may be formed by depositing a metal over the substrate 10. Such metal reacts with the semiconductor material of the exposed regions to form the salicides, which provides low resistance contact to the emitter, the base and the collector of the lateral NPN bipolar transistor 3. The SAB layer 380 at the collector region 303 prevents formation of salicide over the NLDD 312 and pulls the salicide away from the outer edge of the polysilicon gate 304. It is noteworthy that no SAB layer is formed on the emitter region 301. By providing the SAB layer 380 in the lateral NPN bipolar transistor 3, the leakage current due to salicide spike in the NLDD and NLDD 322 may be avoided.

Those skilled in the art will readily observe that numerous modifications and alterations of the device and method may be made while retaining the teachings of the invention.

What is claimed is:

1. A lateral bipolar junction transistor formed in a semiconductor substrate, comprising:
    an emitter region;
    a base region surrounding the emitter region;
    a gate disposed at least over a portion of the base region;
    a collector region having at least one open side and being disposed about a periphery of the base region;
    a shallow trench isolation (STI) region disposed about a periphery of the collector region;
    a base contact region disposed about a periphery of the STI region; and
    an extension region merging with the base contact region and laterally extending to the gate on the at least one open side of the collector region.

2. The lateral bipolar junction transistor according to claim 1 wherein the emitter region has a polygonal shape.

3. The lateral bipolar junction transistor according to claim 1 wherein the lateral bipolar junction transistor is a lateral PNP bipolar transistor and wherein the emitter region is a $P^+$ doped region formed in an N well.

4. The lateral bipolar junction transistor according to claim 1 further comprises a first lightly doped drain (LDD) region disposed between the gate and the collector region.

5. The lateral bipolar junction transistor according to claim 4 further comprises a first salicide block layer disposed on or over the first LDD region.

6. The lateral bipolar junction transistor according to claim 5 further comprises a first salicide on a portion of the collector region not covered by the first salicide block layer.

7. The lateral bipolar junction transistor according to claim 4 wherein the first LDD region is P type doped.

8. The lateral bipolar junction transistor according to claim 4 wherein no LDD is provided on an inner edge of the gate adjacent to the emitter region.

9. The lateral bipolar junction transistor according to claim 1 further comprises a second LDD region disposed between the gate and the extension region.

10. The lateral bipolar junction transistor according to claim 9 further comprises a second salicide block layer disposed on or over the second LDD region.

11. The lateral bipolar junction transistor according to claim 10 further comprises a second salicide on a portion of the extension region not covered by the second salicide block layer.

12. The lateral bipolar junction transistor according to claim 9 wherein the second LDD region is P type doped.

13. The lateral bipolar junction transistor according to claim 1 wherein the base contact region is an $N^+$ doped base contact region.

14. The lateral bipolar junction transistor according to claim 1 wherein a gate dielectric layer is provided between the gate and the base region.

15. The lateral bipolar junction transistor according to claim 14 wherein the gate dielectric layer is formed simultaneously with formation of gate oxide layer in CMOS devices for input/output (I/O) circuits.

16. The lateral bipolar junction transistor according to claim 1 wherein the extension region is an N$^+$ extension region.

17. The lateral bipolar junction transistor according to claim 1 wherein the lateral bipolar junction transistor is a lateral NPN bipolar transistor and wherein the emitter region is an N$^+$ doped region.

* * * * *